United States Patent [19]

Toyomaki

[11] 4,158,175
[45] Jun. 12, 1979

[54] CIRCUIT FOR AUTOMATICALLY SWITCHING OPERATING MODES OF FEEDBACK-CONTROLLED SYSTEMS

[75] Inventor: Kazuya Toyomaki, Yokohama, Japan
[73] Assignee: Nissan Motor Company, Limited, Japan
[21] Appl. No.: 883,845
[22] Filed: Mar. 6, 1978
[30] Foreign Application Priority Data Mar. 7, 1977 [JP] Japan .............................. 52-26237[U]
Mar. 9, 1977 [JP] Japan .................................. 52-24744

[51] Int. Cl.$^2$ ............................................. H04B 1/16
[52] U.S. Cl. .................................. 325/420; 325/453; 331/1 R
[58] Field of Search .................. 325/346, 418–423, 325/453, 465; 358/195; 330/85, 102, 105, 109; 331/1 R, 14, 16, 17, 25

[56] References Cited

U.S. PATENT DOCUMENTS 3,913,029 10/1975 Caspari et al. ........................ 325/421
4,100,578 7/1978 Arneson ............................... 325/418

*Primary Examiner*—Robert L. Griffin
*Assistant Examiner*—Jin F. Ng

*Attorney, Agent, or Firm*—Robert E. Burns; Emmanuel J. Lobato; Bruce L. Adams

[57] ABSTRACT

An automatic switching control circuit is responsive to a command signal as derived from manual tuning operation to change the operating modes of a feedback-controlled system such as automatic frequency control circuit, and includes a first impedance element, an inverting amplifier and a second impedance element in a series circuit between an input terminal to which an error signal from the feedback-controlled signal is applied and an output terminal from which a compensation signal is applied to a modulating element of the feedback-controlled system. A third impedance element is connected between the output terminal and a reference terminal. A switch is provided to establish a short circuit path between the input of the inverting amplifier and the output terminal. The voltage across the third impedance element automatically reduces to substantially zero voltage level in response to the presence of the short circuit path so that the feedback control is suspended. The voltage across the second impedance may be utilized to indicate the signal level of the error signal during the open and closed loop control modes.

26 Claims, 3 Drawing Figures

CIRCUIT FOR AUTOMATICALLY SWITCHING OPERATING MODES OF FEEDBACK-CONTROLLED SYSTEMS

BACKGROUND OF THE INVENTION

The present invention relates generally to feedback control systems and more particularly to a circuit arrangement for use in controlling the operating mades of the feedback controlled system. The invention is particularly suitable for application to automatic frequency control systems.

The use of automatic closed-loop control is widespread in various sectors of modern technologies. For purposes of monitoring the controlled variable of the system to control such variable to within a predetermined limited range, or other purposes, level detectors have heretofore been used in the detection of an error signal which indicatesthe deviation of the controlled variable from the desired value. However, the amount of such deviation which is generated during the closed mode operation is much smaller than the amount of deviation generated when the system is in an open mode or disabled condition. Therefore, the usual practice is to employ a first level detector having a small detectable range for operation in the closed loop mode and a second detector having a larger detectable range for operation in the open loop mode. This entails the use of associated amplifiers and switching circuits which are manually operated in response to the operating mode of the system.

SUMMARY OF THE INVENTION

An object of the invention is to provide a circuit arrangement which permits a single level detector to be employed for utilizing the detected error signal of a closed loop control system for manual control purposes.

This object is achieved by comprising a circuit with a first impedance, an inverting amplifier and a second impedance all of which are connected in the order named in a series circuit between an input terminal connected to receive a deviation from a closed loop controlled system and an output terminal connected to apply a compensation signal to the controlled system. A third impedance is connected across the output terminal and a reference terminal with respect to which the deviation signal varies in amplitude. A switch is provided to establish a short-circuit path from a junction between the first impedance and the inverting amplifier to the output terminal in response to an externally applied signal or manual operation. The amplification gain of the inverting amplifier is selected at a value much larger than $Z_1/Z_2$ and $Z_2/Z_3$, where $Z_1$, $Z_2$ and $Z_3$ are the impedance values of the first, second and third impedance, respectively. In response to the operation of the switch resulting in a short circuit which connects the first impedance to the output terminal, the voltage developed across the second impedance varies substantially with the input error voltage at a first scaling factor which is determined by the relative values of the first and second impedance elements. In response to the operation of the switch to disconnect the short circuit, on the other hand, the scaling factor changes to a second value which is determined by the relative values of the second and third impedance elements and the inverting amplification gain. When the short circuit condition is established, the compensation signal is reduced to substantially zero voltage level so that the system can be considered as operating in an open loop mode and when the short circuit is not present, the compensation signal varies with the input error signal at a scaling factor which is determined by the relative values of the second and third impedance elements and the inverting amplification gain, so that the system operates in a closed loop control mode. Although the voltage across the second impedance varies in different scales depending on the open and closed loop control modes, such scales are primarily determined by the relative values of the impedance elements with the result that a single level detector can be used for detecting the voltage across the second impedance.

The circuit arrangement of the present invention is particularly suitable for application to an automatic frequency controlled system such as employed in a radio receiver or a television receiver. In such applications the level detector is provided with a predetermined threshold value for generating a signal at discrete values depending on whether the voltage across the second impedance element is above or below the threshold level, and the output of the level detector is connected to the switch so that the short circuit path is established in response to the output of the level detector to maintain the system under open loop control mode. Preferably, a delay circuit is provided between the output of the level detector and the control terminal of the switch so as to delay its operation in opening its contacts when the system changes from the open to closed control modes. This allows the user to precisely tune the system to the center frequency of a pull-in range of the automatic frequency control system by preventing it from being locked to a frequency deviating from the center of the pull-in range due to the premature resumption of the closed loop operation. The circuit arrangement of the present invention has an advantageous effect in that it automatically switches the frequency control system from closed to open loop control modes in response to a detuning operation of the user and automatically back to the normal closed loop mode in response to the output from the level detector, directly or via the delay circuit.

BRIEF DESCRIPTION OF THE DRAWINGS

This and other objects, features and advantages of the present invention will be understood from the following detailed description with reference to the accompanying drawings, in which.

DETAILED DESCRIPTION

Figure 1:
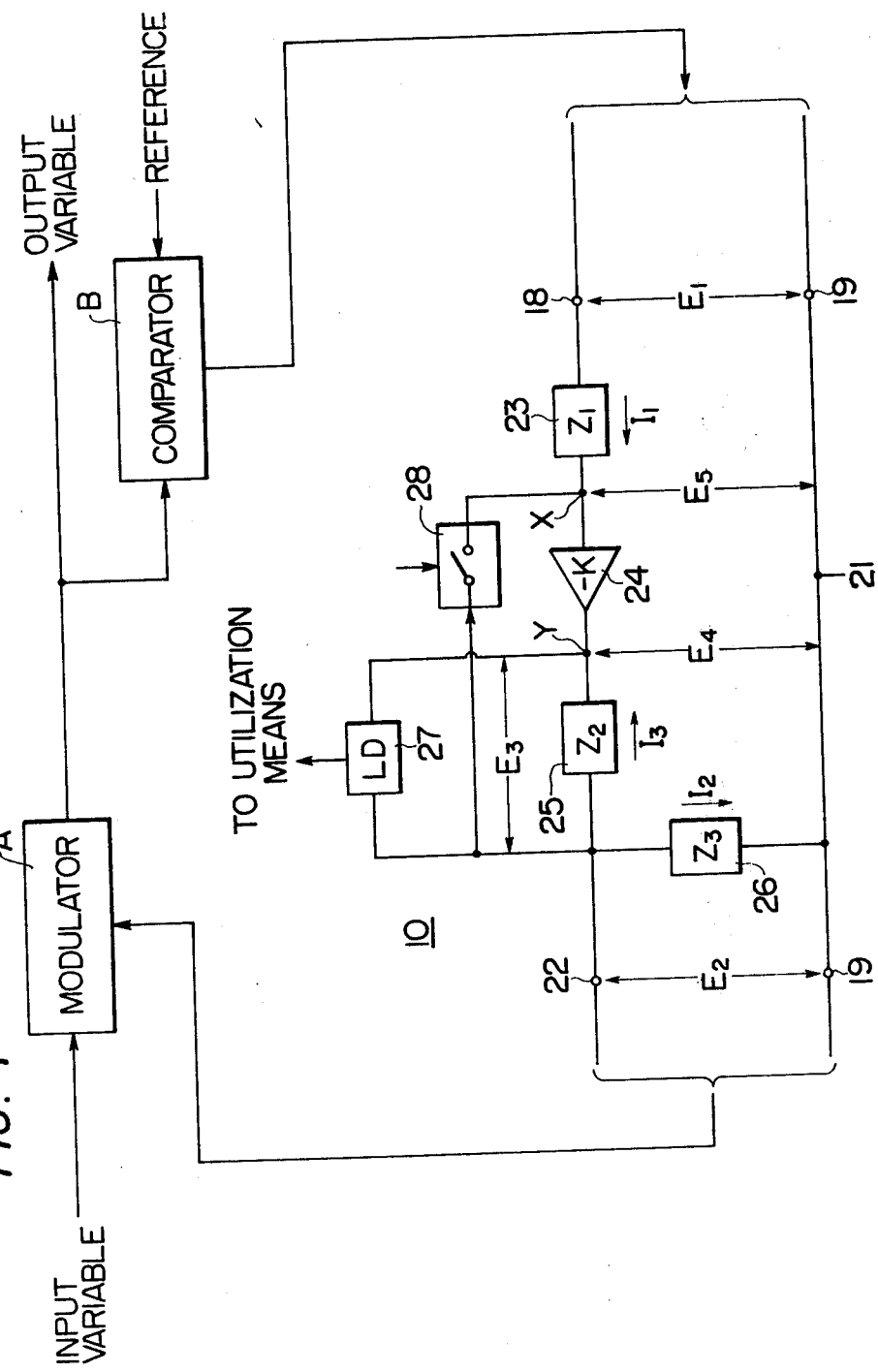
FIG. 1 is a schematic illustration of an embodiment of the invention showing the principle of the invention.

In a schematic illustration of the invention represented in FIG. 1, a closed-loop feedback controlled system is shown comprising generally a modulating device A adapted to receive an input variable such as electrical signal to modify the magnitude or frequency of the input variable in accordance with a compensation signal derived from an automatic control circuit 10 constructed according to the invention. The output variable or signal derived from the modulating device A is utilized for various purposes and at the same time applied to a comparing device B where any deviation of the output variable from a reference magnitude or frequency is determined, resulting in an error signal representing the deviation. The error signal is applied to an input terminal 18 of the circuit 10 which is connected to an output terminal 22 through a feedback path including a first impedance element 23, an inverting amplifier 24 having its input connected to impedance 23 at junction X, and a second impedance element 25 connected at one end to the output of amplifier 24 at junction Y and at the other end to the output terminal 22. Between the output terminal 22 and a reference terminal 19 is connected a third impedance element 26 to develop a compensation signal $E_2$ thereacross. A level detector or indicator 27 is connected across the second impedance 25 to detect a voltage $E_3$, the level detector 27 may or may not be connected to a utilization means (not shown) for utilizing the detected voltage $E_3$ for manual control purposes. A switching means 28 is provided to establish a short circuit path between the junction X and the output terminal 22 in response to an externally applied signal or in response to manual operation thereof.

To analyze the circuit 10 in quantitative terms, assume that impedance elements 23, 25, 26 have impedance values $Z_1$, $Z_2$ and $Z_3$ respectively, and the inverting amplifier 24 have an amplification gain of $-K$. If the switch 28 is assumed to be operated to establish the short circuit, the voltage $E_2$ is of equal value to a voltage $E_5$ between junction X and reference terminal 19, and a voltage $E_4$ between junction Y and reference terminal 19 is made equal to $-KE_5$. Since current $I_1$ through first impedance 23 is equal to the sum of current $I_2$, which passes through third impedance 26, and current $I_3$, which passes through second impedance 25 in opposite direction to current $I_1$, and the voltage $E_3$ is equal to $(1+K)E_2$, the following relations hold:

$$I_1 = \frac{E_1 - E_5}{Z_1} = \frac{E_1 - E_2}{Z_1}$$

where, $E_1$ is a voltage across terminals 18 and 19.

$$I_2 = \frac{E_2}{Z_3}$$

$$I_3 = \frac{E_3}{Z_2} = \frac{(1+K)E_2}{Z_2}$$

Therefore, $$\frac{E_1 - E_2}{Z_1} = \frac{E_2}{Z_3} + \frac{(1+K)E_2}{Z_2}$$

Thus, $$E_2 = \frac{Z_2 Z_3}{Z_1 Z_2 + Z_2 Z_3 + Z_1 Z_3 (1+K)} E_1 \quad (1)$$

$$E_3 = \frac{Z_2 Z_3 (1+K)}{Z_1 Z_2 + Z_2 Z_3 + Z_1 Z_3 (1+K)} E_1 \quad (2)$$

Assume that the value K is much larger than $Z_2/Z_1$ and $Z_2/Z_3$, the following relations are obtained:

$$E_2 \doteq 0 \quad (1a)$$

$$E_3 \doteq \frac{Z_2}{Z_1} E_1 \quad (2a)$$

Equation (1a) is interpreted to mean that under the short-circuited condition the feedback controlled system is switched to an open loop mode from the normal closed loop mode since the compensation voltage across terminals 22 and 19 is substantially zero voltage level. Under this open loop condition, the voltage $E_3$ varies as a function of the error signal $E_1$ at a scaling factor of $Z_2/Z_1$.

When the switch 28 is released to cut off the short circuit, the voltage $E_5$ is substantially equal to $E_1$ if the inverting amplifier 24 has a much higher input impedance than impedance $Z_1$, and therefore $E_4 = -KE_1$. Equations (1) and (2) can be rewritten as follows:

$$E_2 = \frac{Z_3}{Z_2 + Z_3} E_4 = -\frac{KZ_3}{Z_2 + Z_3} E_1 \quad (3)$$

$$E_3 = \frac{L_2}{Z_2 + Z_3} E_4 = \frac{KZ_2}{Z_2 + Z_3} E_1 \quad (4)$$

Therefore, the compensation voltage $E_2$ varies substantially as a function of the error voltage $E_1$ so that the feedback controlled system is operating in a closed control mode. Under this closed loop condition, voltage $E_3$ varies as a function of the error voltage $E_1$ at a scaling factor of $KZ_2/(Z_2+Z_3)$.

It will be understood that if the impedance values $Z_1$, $Z_2$ and $Z_3$ are suitably selected, the scaling factors of the voltage $E_3$ during the open loop and closed loop modes can be determined respectively so that it is possible that the varying range of voltage $E_3$ can be controlled to within the detectable range of the level detector 27.

Figure 2:
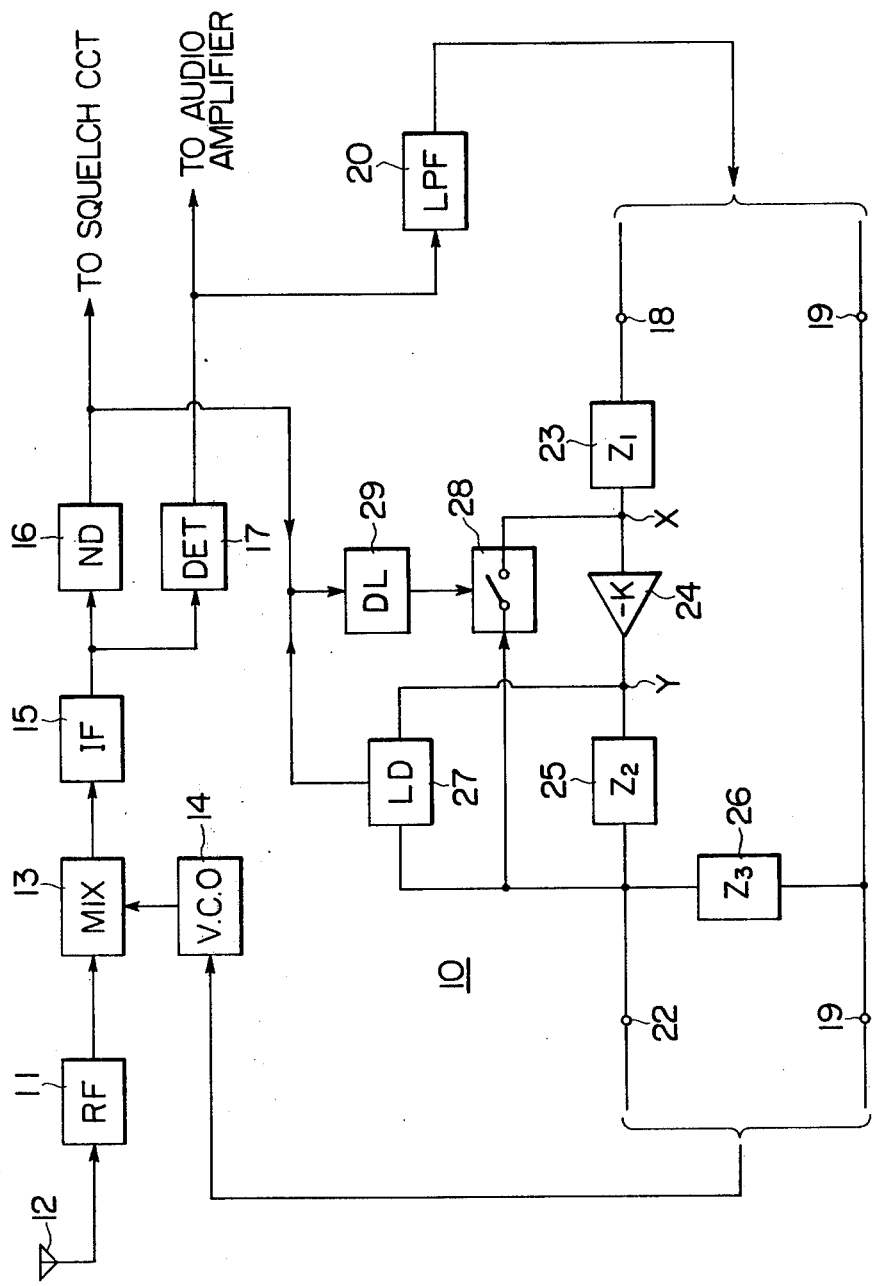
FIG. 2 is an illustration of a practical embodiment of the invention.

FIG. 2 is an illustration of a practical embodiment of the invention in which the feedback controlled system comprises an automatic frequency control circuit of a conventional FM radio receiver including a radio frequency tuning section 11 which is adapted to be tuned to RF signals received at antenna 12. A mixer 13 receives a tuned RF signal and mixes it with a signal from a voltage-controlled oscillator 14 to generate an intermediate frequency signal for amplification by an IF amplifier 15. The voltage-controlled oscillator 14 receives its input compensation signal from the output of the control circuit 10 to vary its output frequency with the input DC signal. To the output of the IF amplifier 15 are connected a no-signal detector 16 and a frequency modulation detector 17. The output of the no-signal detector 16 is connected to a squelch circuit for suppressing noise which occurs during detuned periods. The FM detector 17 may be of conventional design in which the detector 17 generates an output which varies in magnitude with the instantaneous frequency of the IF signal when the received signal is turned to the resonant frequency and when detuned the output is substantially a DC signal indicating the direction and amount of deviation from the point of resonance. The output from the FM detector 17 is passed through a lowpass filter 20 to eliminate the high frequency signal components to derive the DC error signal so that voltage $E_1$ varies in polarity depending on whether the received signal is above or below resonance and varies in magnitude depending on the deviation of the received signal from the resonant frequency.

The control circuit 10 of the invention shown in FIG. 2 is generally similar to that shown in FIG. 1 except that the level detector 27 is arranged to operate the switch 28 in response to the voltage $E_3$ exceeding a predetermined threshold level to automatically switch the AFC circuit into the open-loop control mode.

The switch 28 may also be activated in response to the output of no-signal detector 16. This detector is designed to provide a high-level output whenever the IF output is below a predetermined signal level so that switch 28 remains closed when the system is out of tune or when the received RF signal is very weak even though the system is in tune. Whereas, the output of FM detector 17 is at zero voltage when the system is detuned greatly from the resonant frequency of the individual radio channels, but varies both in magnitude and polarity as long as the received signal frequency lies within its error detection range. An asymmetrical delay circuit 29 is preferably provided through which the switch 28 is activated in response to the one of the outputs from the level detector 27 and the no-signal detector 16 which is stronger in signal level than the other. This delay circuit provides a delayed action to the switch 28 only when the system is in the process of being switched from open- to closed-loop modes.

In operation, assume that the FM receiver is detuned from resonance during the process of a user's tuning operation and thus results in a high-voltage output from the no-signal detector 16, the switch 28 is closed and hence zero voltage output at the output terminal 22 so that the AFC circuit operates in open loop mode in the manner as previously described. The voltage $E_3$ given by Equation (2a) exceeds the threshold level of the level detector 27 resulting in an output therefrom which is applied to the switch 28 to maintain it in the closed state. As the resonant frequency is approached, the error voltage $E_1$ reduces in magnitude which in turn causes voltage $E_3$ across level detector 27 to fall below the threshold level thereof providing a low-level voltage to the delay circuit 29. In response to this low-level signal, the delay circuit 29 initiates a delay action so as to allows the switch 28, to release at a delayed timing. This delayed action prevents the AFC circuit from instantly entering the closed loop mode and allows the tuned frequency to arrive at the center frequency of the pull-in range of the AFC circuit. Otherwise, the AFC circuit would be locked to a frequency near the edge of the pull-in range rather than to the correct frequency. Such delayed action is particularly advantageous for AFC circuits having a relatively wide pull-in range capability.

Figure 3:
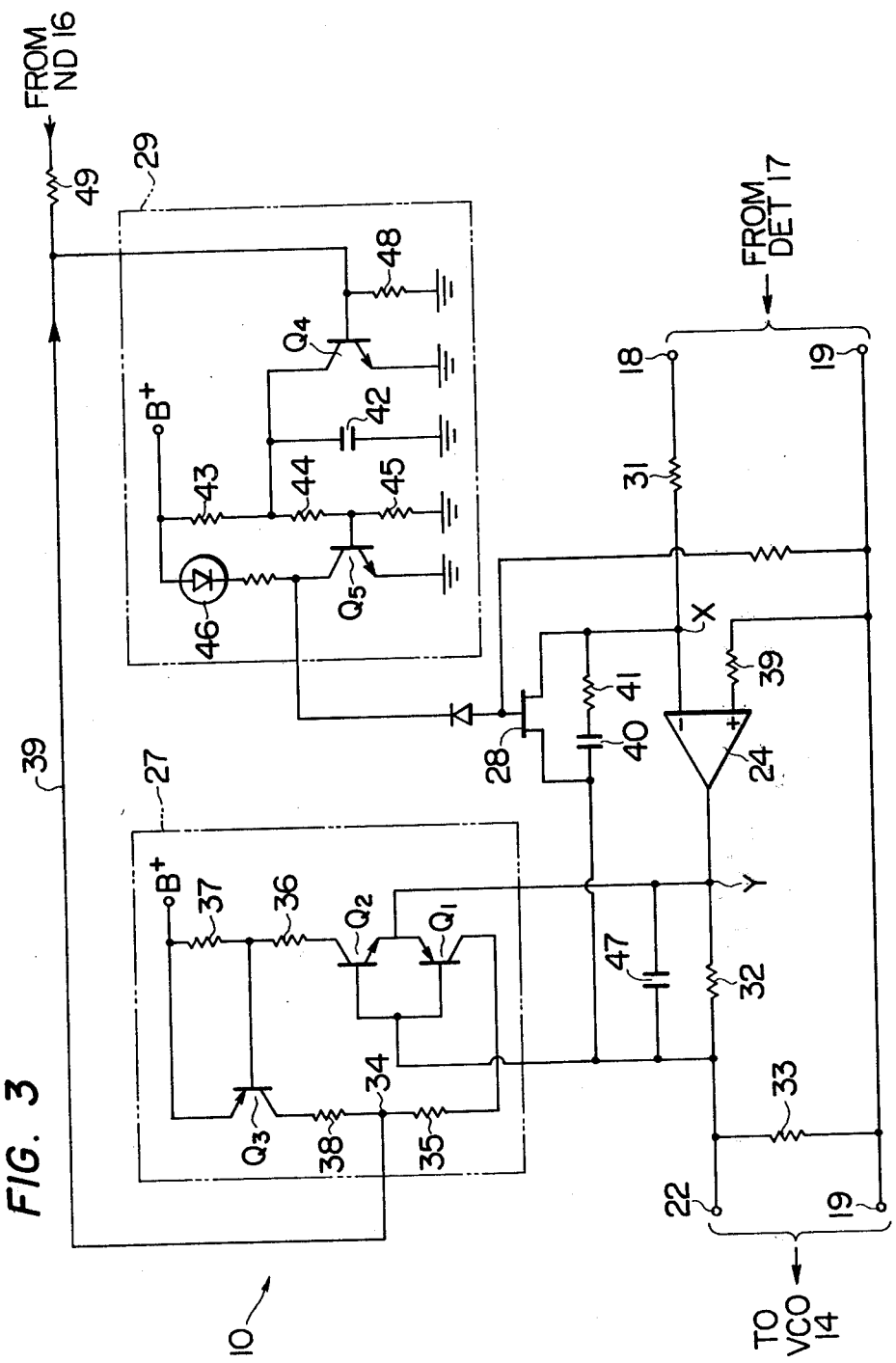
FIG. 3 is an illustration of the detail of FIG. 2.

FIG. 3 is an illustration of the detailed circuit diagram of automatic frequency control circuit 10 of FIG. 2. In this illustration, impedances $Z_1$ and $Z_3$ are represented by resistances 31, 32 and 33, respectively. The level detector 27 is shown comprised by a pnp transistor Q1 and an npn transistor Q2 connected in a series circuit, with the junction between their emitters connected to the junction Y and the junction between their base electrodes connected together to the output terminal 22. The collector of transistor Q1 is connected to a junction 34 by a resistor 35, the collector of transistor Q2 being connected to a voltage supply B+ by series connected resistors 36, 37. To the junction between resistors 36 and 37 is connected the base electrode of a third transistor Q3 whose emitter is connected to the voltage supply B+ with its collector being connected to the junction 34 by a resistor 38. The junction 34, which is the output terminal of level detector 27, is connected by lead 39 to the input of the delay circuit 29. When the received signal is below resonance, the output from the inverting amplifier 24 is positive and if the positive output from amplifier 24 exceeds the threshold level of the transistor Q1, transistor Q1 is rendered conductive and applies a positive potential to the junction 34 and thence to the delay circuit 29. If the received signal is above resonance, the situation is reversed so that transistor Q2 is rendered conductive, which turns on transistor Q3 and applies a positive potential to the junction 34. Therefore, the level detector 27 generates a positive output whenever the system is detuned from resonance regardless of the direction of the deviation from the resonant frequency.

The inverting amplifier 24 is represented by an operational amplifier having a noninverting input terminal connected by a resistor 39 to the reference terminal 19 and an inverting input terminal connected to the junction X. The switch 28 is represented by a field-effect transistor having its source and drain electrodes connected by series-connected capacitor 40 and resistor 41 and the junction X is connected through the source-drain path of the transistor 28 to the output terminal 22.

The delay circuit 29 represented in FIG. 3 comprises a transistor Q4 with its base electrode connected to receive the output from the detector 27 or from the no-signal detector 16. An input resistor 48 is coupled between the base of transistor Q4 and ground, and a resistor 49 is connected in the circuit from the no-signal detector 16 to the base of transistor Q4. The relative values of the resistors 48 and 49 are so selected that the transistor Q4 operates in response to the one of the input signals from the detectors 16 and 27 which is larger in magnitude than the other. In response to the presence of a high-level input either from no-signal detector 16 or level detector 27, the transistor Q4 is turned on to instantly discharge a storage capacitor 42 and in response to the presence of a low-level input, transistor Q4 is turned off to allow the capacitor 42 to charge up through resistor 43 until the voltage across series-connected resistors 44 and 45 is reached. The junction between resistors 44 and 45 is connected to the base of transistor Q5 so that transistor Q5 is instantly turned on in response to the presence of a high-level input to the delay circuit and turned off at a delayed timing in response to the presence of a low-level input to the delay circuit. During the time when the system is tuned to resonance (the presence of a low-level input to the delay circuit 29), transistor Q5 remains conductive to light up a light-emitting diode 46 and during the detuning period it remains nonconductive to de-energize the LED 46 and apply a positive potential to the control gate of field-effect transistor 28 to turn it on. Therefore, the delay circuit 29 acts as a signal transfer element to the switch 28 in response to the occurrence of a detuned condition, but acts as a delay element for introducing a delay interval from the time of occurrence of a slightly tuned condition to allow the system to be precisely tuned to the center frequency of the pull-in range as described above.

While the system is in tune, i.e. the switch 28 is open, the series circuit of capacitor 40 and resistor 41 negatively feeds back the high-frequency components of the error signal from FM detector to the inverting input terminal of the operational amplifier 24. This high-frequency negative feedback operation is to impart a lowpass frequency characteristics to the input signal applied to the amplifier 24 so that the lowpass filter 20 of FIG. 2 can be realized in a simplified, low cost circuit. A capacitor 47, connected across the resistor 32, is to provide a low impedance path for the negatively fed-back high-frequency signal to prevent it from developing an unwanted voltage across the resistor 32.

As previously described, while the operating characteristic of the FM detector 17 is such that its output voltage is zero when the system is greatly detuned from adjacent radio channels, the output of the no-signal detector 16 is high under these circumstances so that the switch 28 remains closed to maintain the system to operate in the open-loop control mode.

It is understood from the foregoing description that the control circuit 10 of the invention provides automatic disablement of the closed loop control when the system is manually detuned during channel selection operations. If the frequency holding range of the AFC circuit is greater than the frequency interval between adjacent radio channels, a tuning operation, if operated with the AFC being enabled, would result in a failure to capture the adjacent channel.

In a preferred embodiment of the invention, the relative values of impedances $Z_1$ and $Z_2$ should be selected so that the detection sensitivity of the level detector 27 during the open loop mode corresponds to the pull-in range of the AFC circuit, and the relative values impedances $Z_2$ and $Z_3$ should be so selected that the detection sensitivity of detector 27 during the closed loop mode corresponds to the holding range of the AFC circuit.

What is claimed is:

1. A circuit arrangement for use in a feedback controlled system, comprising first impedance means, an inverting amplifier and a second impedance means all of which are connected in the order named in a series circuit from an input terminal to an output terminal, third impedance means connected between the output terminal and a reference terminal, means for establishing a short circuit path between an input of said inverting amplifier and said output terminal in response to an external signal, said input terminal being connected in use to receive a signal from said feedback controlled system representing the deviation of a controlled variable in said system with respect to said reference terminal, and said output terminal being connected to use to apply a resultant voltage across said third impedance means to said feedback controlled system to compensate for said deviation, said inverting amplifier having such a large value of amplification gain as compared with $Z_2/Z_1$ and $Z_2/Z_3$ wherein $Z_1$, $Z_2$ and $Z_3$ are the impedance values of said first, second and third impedance means respectively that in response to the presence of said short circuit path the voltage across said third impedance means is substantially reduced to zero so that the system is considered as operating in an open loop control mode and in response to said switching means disabling said short circuit path said voltage across said third impedance means varies as a function of said deviation representative signal.

2. A circuit arrangement as claimed in claim 1, further comprising means for detecting the voltage across said second impedance means.

3. A circuit arrangement as claimed in claim 2, wherein the output of said voltage detecting means is connected to activate said short-circuit establishing means.

4. A circuit arrangement as claimed in claim 1, wherein said inverting amplifier has a greater input impedance than the impedance value of said first impedance means.

5. A circuit arrangement as claimed in claim 1, further comprising filter means connected in parallel with said switching means.

6. A circuit arrangement as claimed in claim 1, wherein each of said first, second and third impedance means comprises a resistor.

7. A circuit arrangement as claimed in claim 2, wherein said voltage detecting means includes means for generating a single output in response to the voltage across said second impedance means exceeding a predetermined threshold level regardless of the polarity of said voltage.

8. A circuit arrangement as claimed in claim 7, wherein said voltage detecting means comprises first and second polarity sensitive means respectively responsive to a first and a second polarity of the voltage across said second impedance means to generate first and second polarity signals respectively, means for converting the polarity of said second polarity signal to the first polarity and means for combining said first polarity signal from said first polarity sensitive means and said converted signal from said converting means.

9. A circuit arrangement as claimed in claim 8, wherein said first and second polarity sensitive means are formed by a pair of first and second transistors of opposite conductivity types having their emitters connected together to one terminal of said second impedance means and having their base electrodes connected together to the other terminal of said second impedance means.

10. A circuit arrangement as claimed in claim 1, wherein said inverting amplifier comprises an operational amplifier having a noninverting input terminal connected to said reference terminal and an inverting input terminal connected to said first impedance means.

11. A circuit arrangement as claimed in claim 1, wherein said switching means is a field-effect transistor.

12. An automatic frequency control circuit for a radio receiver having a mixer and adapted to receive radio signals on frequency-divided channels, comprising, a voltage controlled oscillator to provide a local oscillation signal with which said received signal is mixed in said receiver to generate an intermediate frequency signal, means for detecting the deviation of the intermediate frequency signal from the intermediate frequency signal center frequency, a feedback path having an input terminal connected to the output of said deviation detecting means and an output terminal connected to the input of said voltage-controlled oscillator including first impedance means, an inverting amplifier and second impedance means all of which are connected in the order named from said input terminal to said output terminal, third impedance means connected between said output terminal and a reference terminal, a level detector connected across said second impedance means to provide an output signal when the voltage thereacross exceeds a predetermined threshold level, and switching means connected betwen the input of said inverting amplifier and said output terminal of the feedback path to provide a short-circuit path therebetween in response to the output signal from said level detector, said inverting amplifier having a large value of amplification factor as compared with $Z_2/Z_1$ and $Z_2/Z_3$ wherein $Z_1$, $Z_2$ and $Z_3$ are the impedance values of said first, second and third impedance means, respectively.

13. An automatic frequency control circuit as claimed in claim 12, further comprising means for imparting a delayed action to said switching means when said receiver is in the process of being switched from detuned to tuned conditions.

14. An automatic frequency control circuit as claimed in claim 13, wherein said delayed action imparting means is responsive to the output signal from said lever detector to provide a delay interval before said switching means is opened.

15. An automatic frequency control circuit as claimed in claim 14, wherein said delayed action imparting means comprises a first transistor responsive to the presence of said output signal from said level detector, a storage capacitor for storing electrical energy in response to said first transistor being nonconductive, and a second transistor responsive to the stored electrical energy reaching a predetermined level, said switching means being responsive to the state of said second transistor.

16. An automatic frequency control circuit as claimed in claim 12, wherein said deviation detecting means comprises a frequency-modulation detector and a lowpass filter connected to the output of the frequency-modulator detector.

17. An automatic frequency control circuit as claimed in claim 16, wherein said inverting amplifier comprises an operational amplifier having an inverting input terminal receptive of the output of said frequency-modulation detector and a noninverting input terminal connected to said reference terminal, and wherein said lowpass filter is formed by an RC circuit connected in parallel with said switching means to provide a low-impedance path for the high-frequency components of the signal from said frequency-modulation detector when said switching means is not providing said short-circuit path so that the high-frequency component signal is negatively fed back to said operational amplifier.

18. An automatic frequency control circuit as claimed in claim 12, wherein said deviation detecting means comprises a frequency modulation detector.

19. An automatic frequency control circuit as claimed in claim 18, wherein said level detector comprises first and second polarity sensitive means respectively responsive to a first and a second polarity of the voltage across said second impedance means to generate first and second polarity signals respectively, means for converting the polarity of said second polarity signal to the first polarity and means for applying the output of said first polarity sensitive means and the output of said converting means to said switching means.

20. An automatic frequency control circuit as claimed in claim 19, wherein said first and second polarity sensitive means are formed by a pair of first and second transistors of opposite conductivity types having their emitters connected together to one terminal of said second impedance means and having their base electrodes connected together to the other terminal of said second impedance means.

21. An automatic frequency control circuit as claimed in claim 12, wherein each of said first, second and third impedance means comprises a resistor.

22. An automatic frequency control circuit as claimed in claim 12, wherein said inverting amplifier comprises an operational amplifier having a noninverting input terminal connected to said reference terminal and an inverting input terminal connected to said first impedance means.

23. An automatic frequency control circuit as claimed in claim 22, wherein said switching means is a field-effect transistor.

24. An automatic frequency control circuit as claimed in claim 12, further comprising a filter capacitor connected across said second impedance means.

25. An automatic frequency control circuit as claimed in claim 12, further comprising means for detecting the absence of said intermediate frequency signal for activating said switching means.

26. An automatic frequency control circuit as claimed in claim 12, wherein the relative values of said first and second impedance means are selected such that the detectable range of said lever detector corresponds to the pull-in range of said automatic frequency control circuit in the presence of said short-circuit path and wherein the relative values of said second and third impedance means are selected such that the detectable range of said level detector corresponds to the holding range of said automatic frequency control circuit in the absence of said short-circuit path.

* * * * *